(12) United States Patent
Sho et al.

(10) Patent No.: US 11,310,929 B2
(45) Date of Patent: Apr. 19, 2022

(54) DISPLAY DEVICE

(71) Applicant: LG ELECTRONICS INC., Seoul (KR)

(72) Inventors: Weonyoung Sho, Seoul (KR); Youngwook Kang, Seoul (KR); Sangmin Kim, Seoul (KR); Huisik Kim, Seoul (KR); Honghae Do, Seoul (KR); Sungmo Im, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/961,658

(22) PCT Filed: Jun. 14, 2018

(86) PCT No.: PCT/KR2018/006730
§ 371 (c)(1),
(2) Date: Jul. 10, 2020

(87) PCT Pub. No.: WO2019/142980
PCT Pub. Date: Jul. 25, 2019

(65) Prior Publication Data
US 2020/0367377 A1    Nov. 19, 2020

(30) Foreign Application Priority Data

Jan. 16, 2018    (KR) .......................... 10-2018-0005690

(51) Int. Cl.
*H05K 5/02*        (2006.01)
*H05K 5/00*        (2006.01)
*H01L 51/52*       (2006.01)

(52) U.S. Cl.
CPC ......... *H05K 5/0217* (2013.01); *H05K 5/0017* (2013.01); *H01L 51/5237* (2013.01)

(58) Field of Classification Search
None
See application file for complete search history.

(56) References Cited

U.S. PATENT DOCUMENTS 9,116,662 B1 *  8/2015  Song ...................... G09G 3/001
9,548,007 B2 *  1/2017  Schmidt ............. G09F 15/0018
(Continued)

FOREIGN PATENT DOCUMENTS

CN         106033654         10/2016
KR         20140141400       12/2014
(Continued)

OTHER PUBLICATIONS

PCT International Application No. PCT/KR2018/006730, International Search Report dated Oct. 15, 2018, 3 pages.

*Primary Examiner* — Xanthia C Cunningham
(74) *Attorney, Agent, or Firm* — Lee, Hong, Degerman, Kang & Waimey PC

(57) ABSTRACT

The present disclosure includes a display module, a first frame that is disposed to be long along an upper side of the display module and is convexly bent toward a front side of the display module, a second frame that is spaced apart from the first frame in the vertical direction, is disposed to be long along a lower side of the display module, and is convexly bent in the same direction as the first frame, a third frame disposed between one side of the first frame and one side of the second frame, a fourth frame spaced apart from the third frame in the left-right direction and disposed between the other side of the first frame and the other side of the second frame, an upper sliding member mounted movably in the first frame and fixed to the upper side of the display module, and a lower sliding member mounted movably in the second frame and fixed to the lower side of the display module.

13 Claims, 16 Drawing Sheets

(56) References Cited

U.S. PATENT DOCUMENTS

| | | | | |
|---|---|---|---|---|
| 9,560,775 | B2* | 1/2017 | Park | H04N 5/64 |
| 9,843,758 | B2* | 12/2017 | Park | G09G 3/03 |
| 10,165,697 | B2* | 12/2018 | Kim | H05K 5/0234 |
| 10,278,300 | B2* | 4/2019 | Kim | F16M 11/22 |
| 10,845,631 | B2* | 11/2020 | Kim | G02F 1/133603 |
| 2011/0222248 | A1* | 9/2011 | Sakai | H05K 7/1417 |
| | | | | 361/749 |
| 2015/0097923 | A1* | 4/2015 | Kim | H04N 21/42204 |
| | | | | 348/36 |
| 2015/0145837 | A1* | 5/2015 | Park | H04N 21/42204 |
| | | | | 345/184 |
| 2015/0243194 | A1 | 8/2015 | Schmidt et al. | |
| 2015/0346537 | A1* | 12/2015 | Yu | G02F 1/133308 |
| | | | | 349/60 |
| 2018/0220537 | A1* | 8/2018 | Heo | G09F 9/3026 |
| 2020/0212326 | A1* | 7/2020 | Eom | H02K 7/1004 |
| 2020/0278722 | A1* | 9/2020 | Hudgins | G06F 1/1616 |

FOREIGN PATENT DOCUMENTS

| | | |
|---|---|---|
| KR | 20150041482 | 4/2015 |
| KR | 20150136810 | 12/2015 |

\* cited by examiner

[FIG. 1]
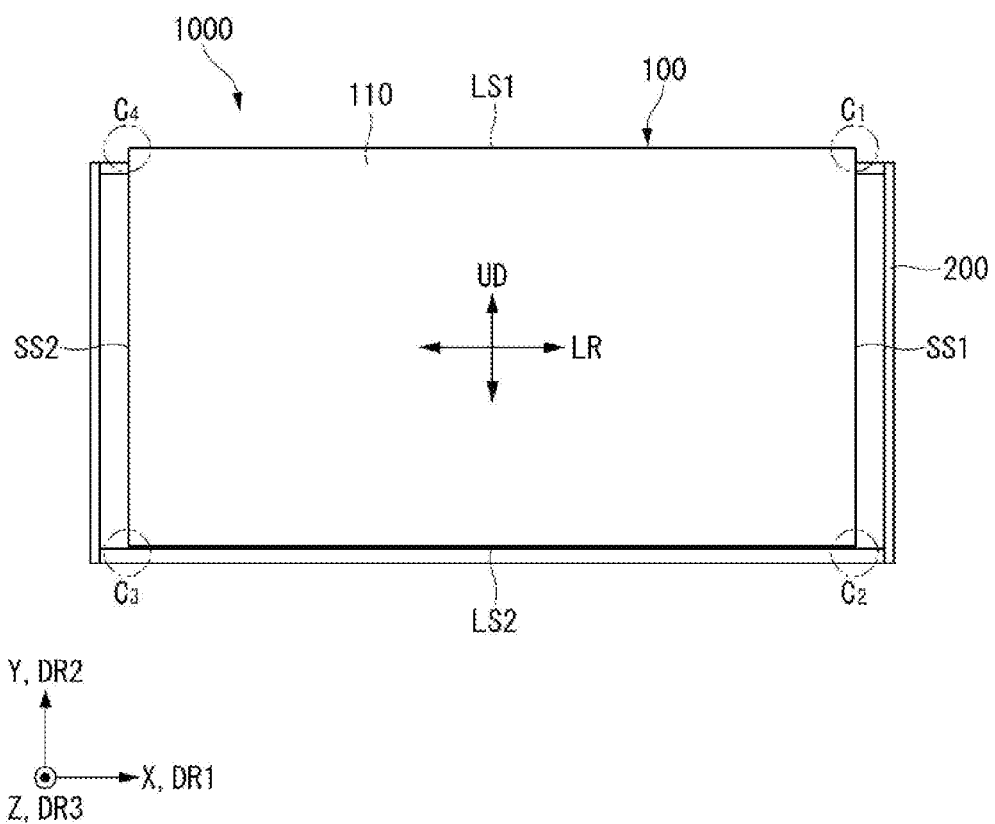

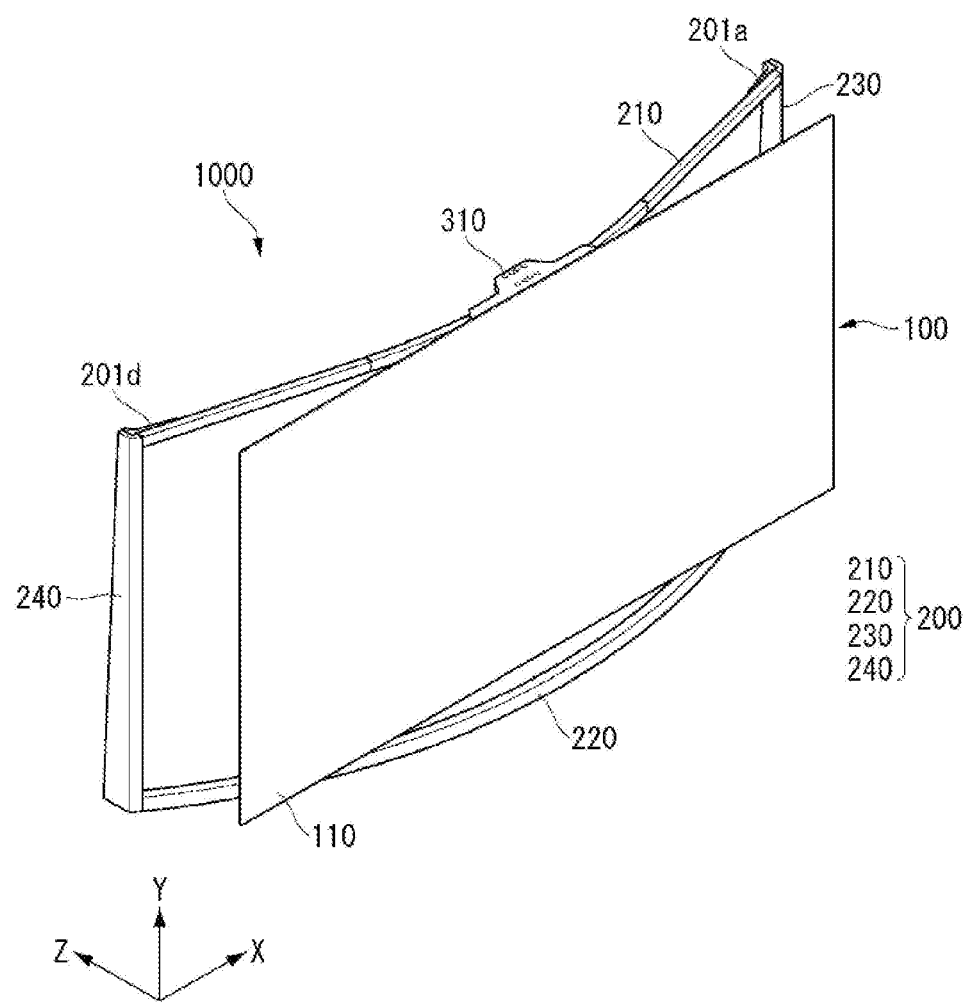
[FIG. 2]

[FIG. 3]
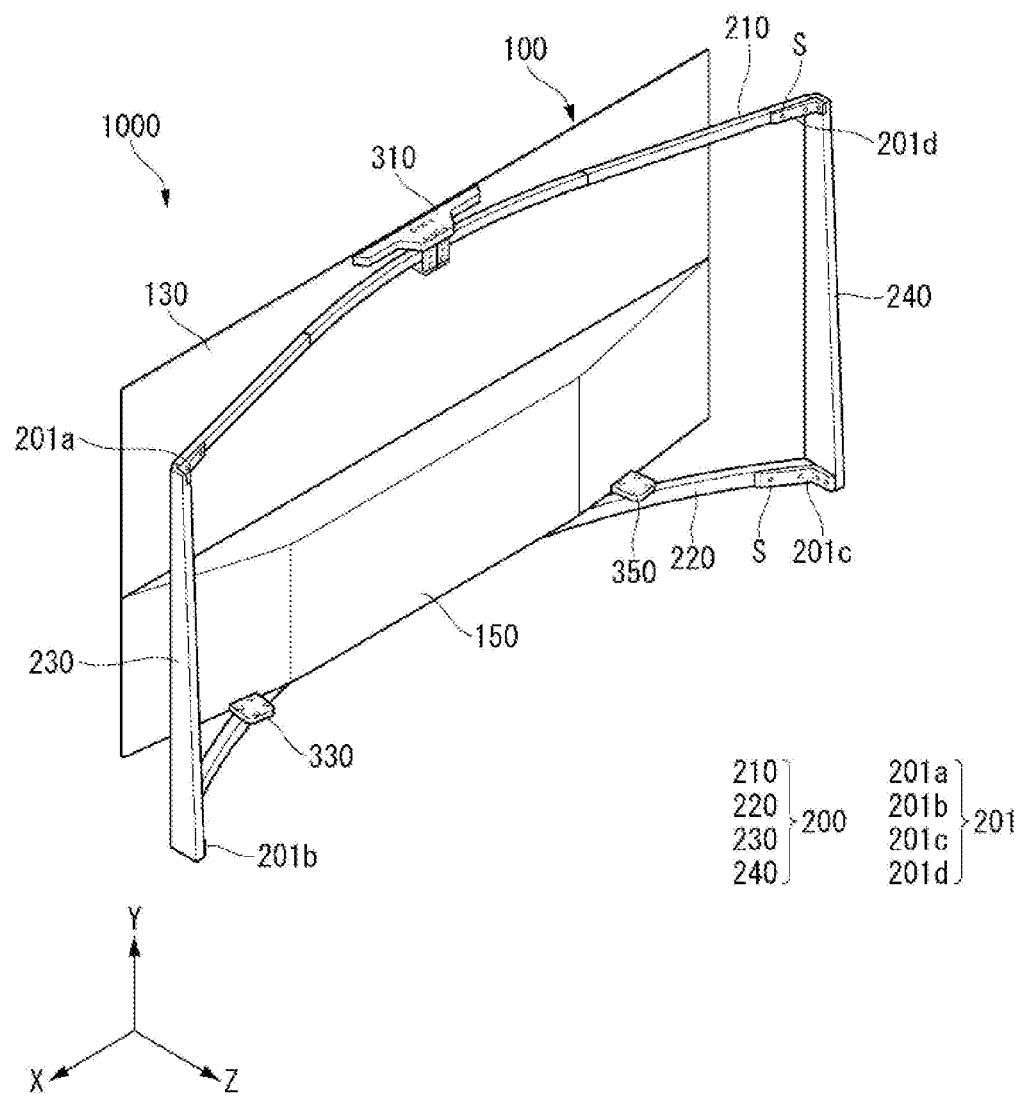

[FIG. 4]
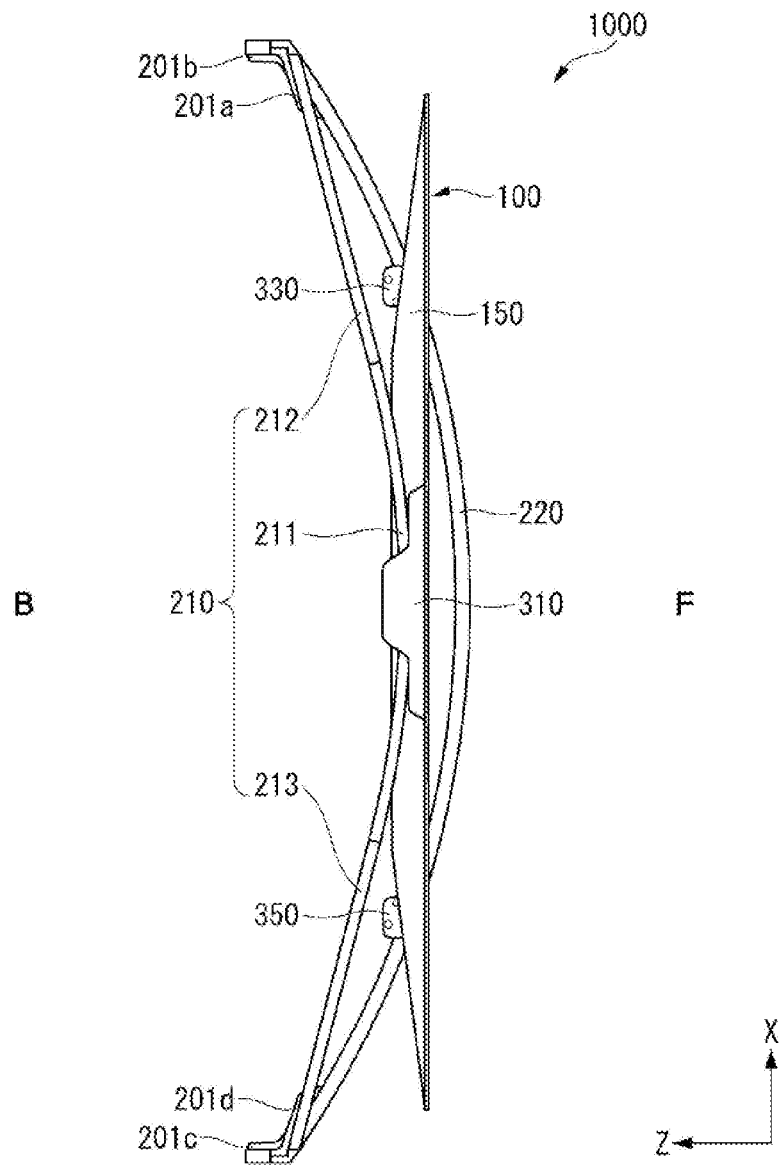

[FIG. 5]
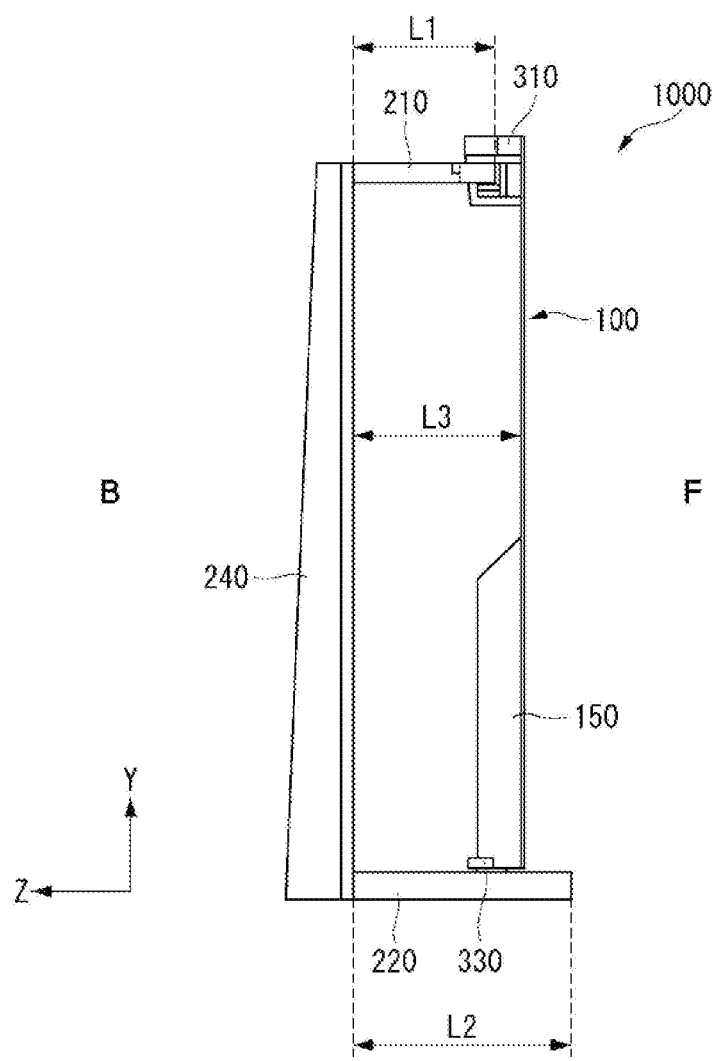

[FIG. 6]
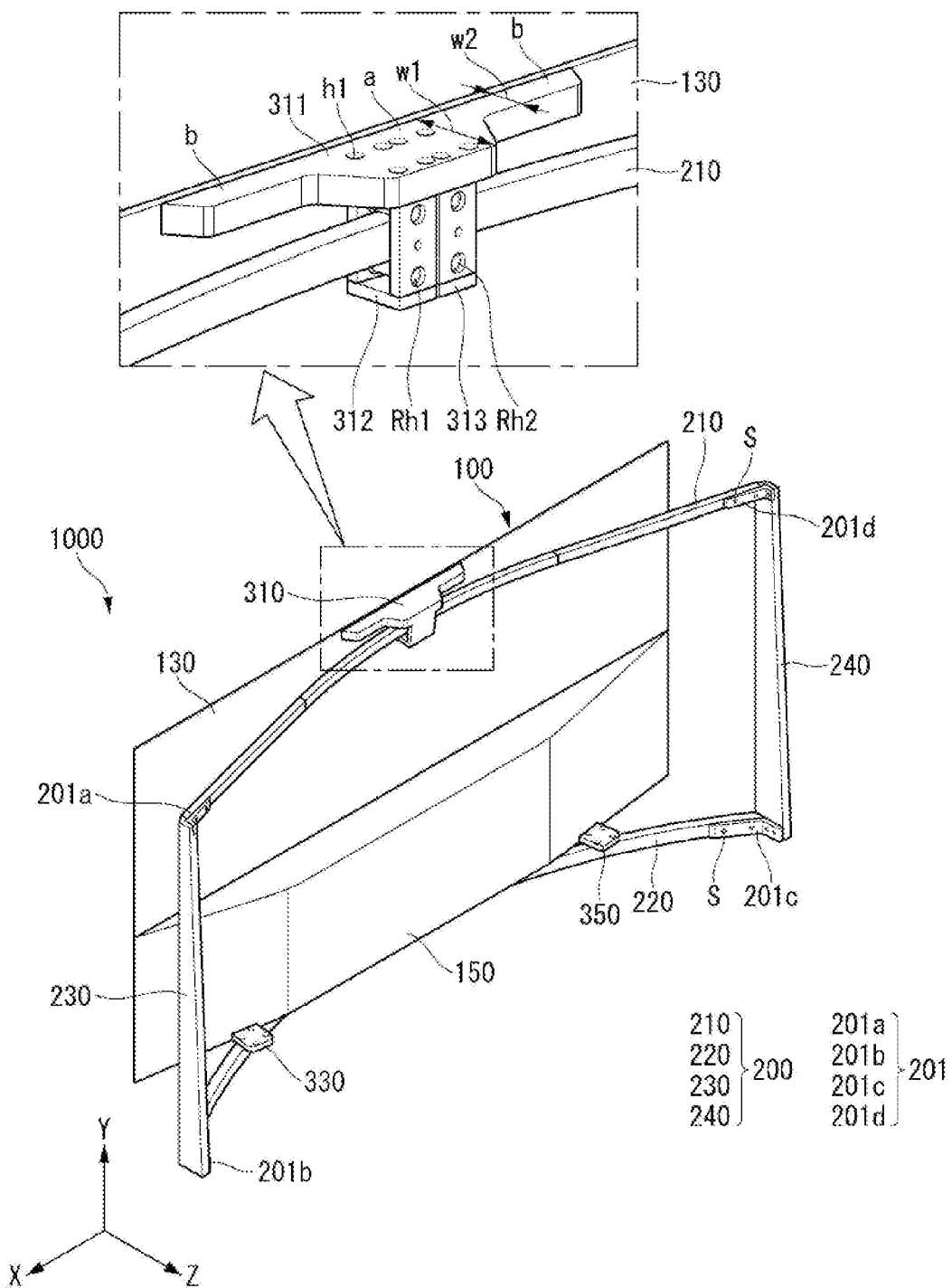

【FIG. 7】
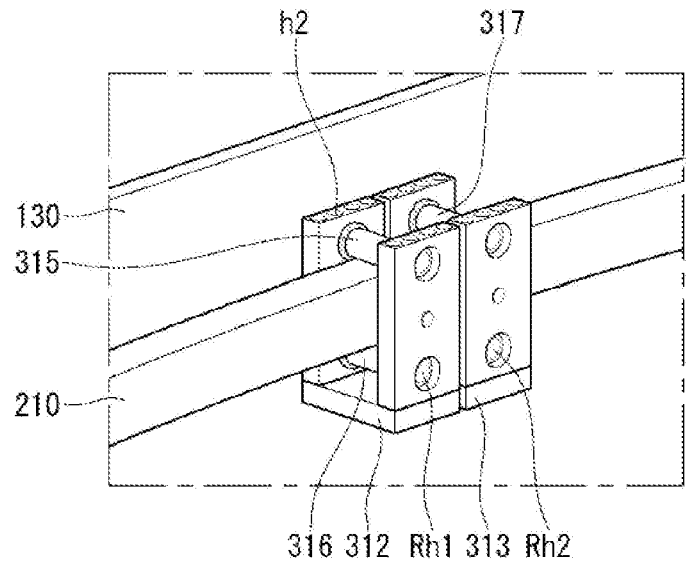
【FIG. 8】
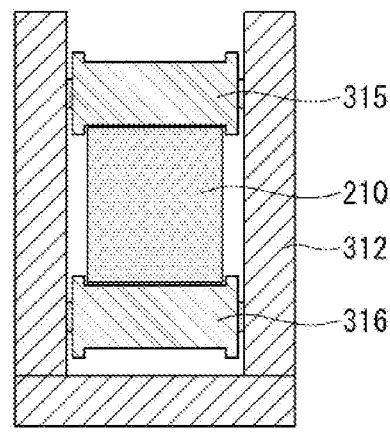

[FIG. 9]
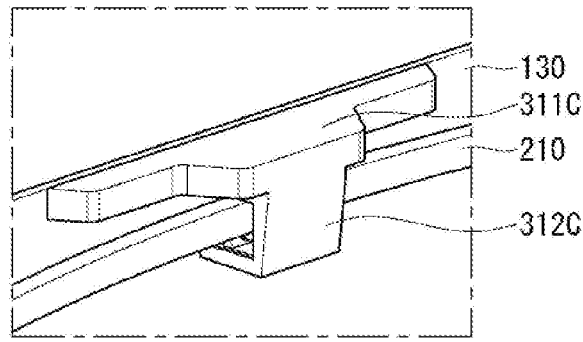

【FIG. 10】
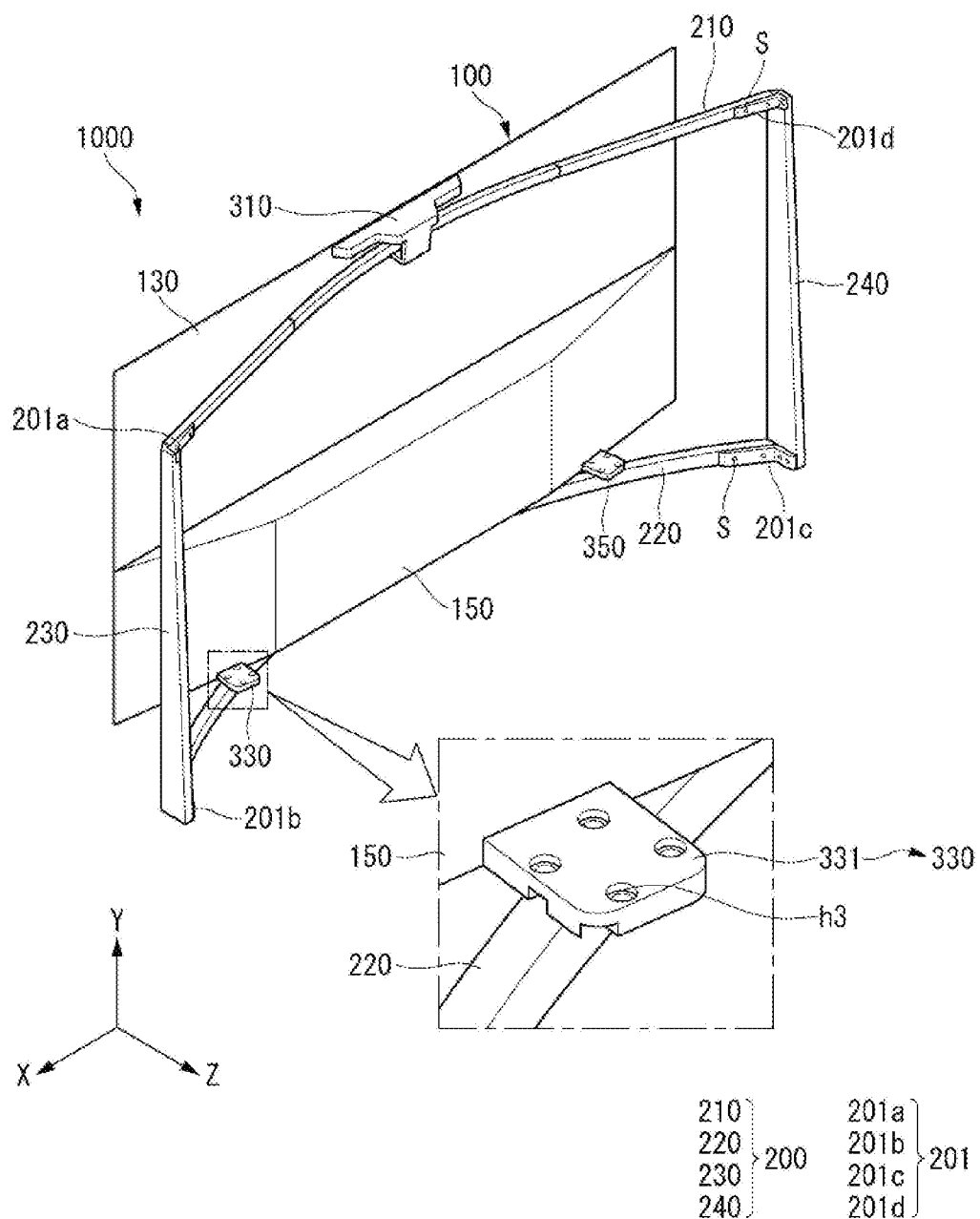

[FIG. 11]
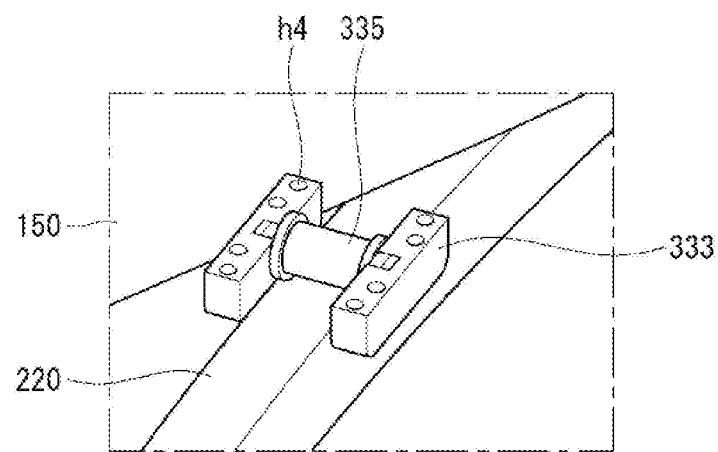
[FIG. 12]
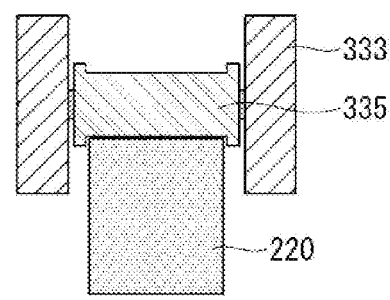

[FIG. 13]
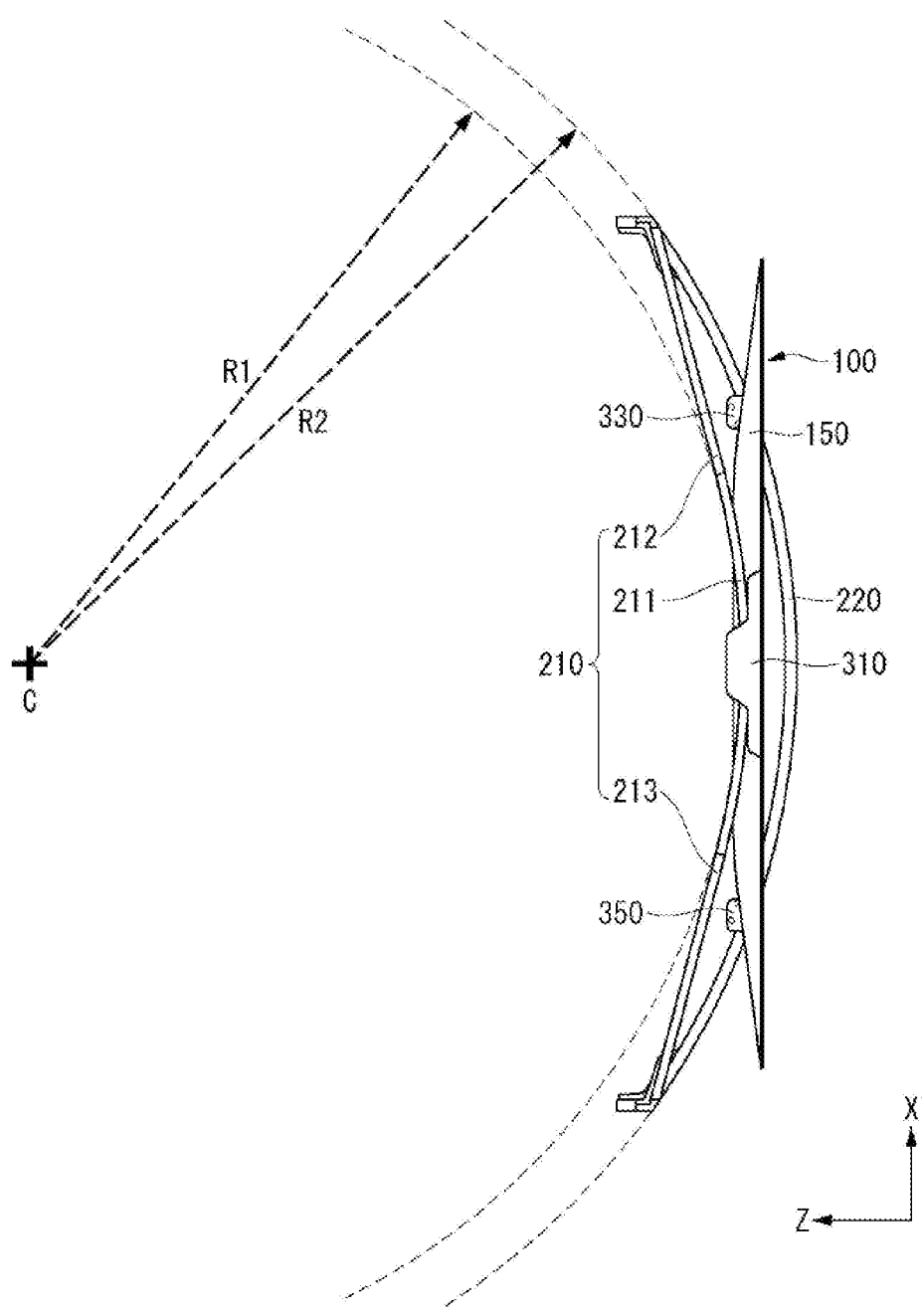

[FIG. 14]
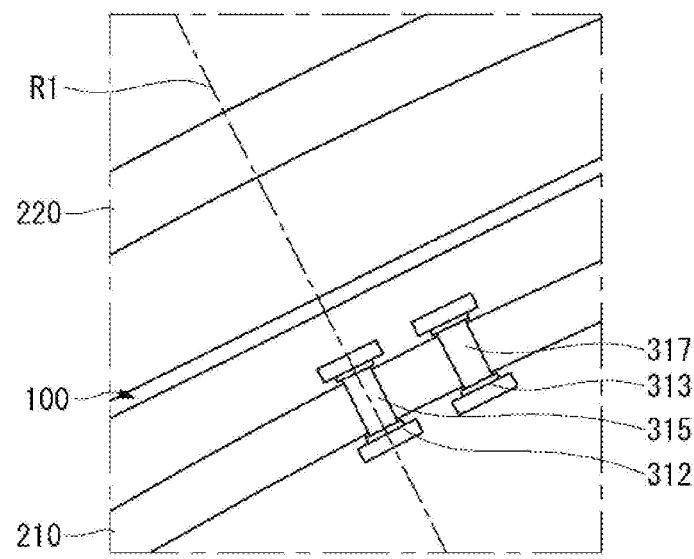
[FIG. 15]
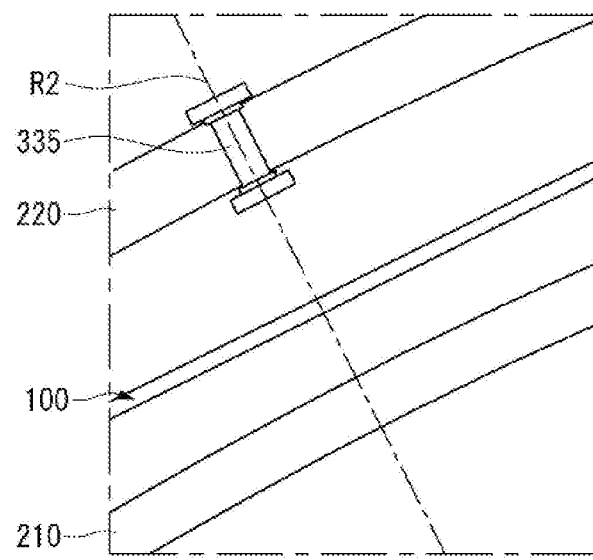

[FIG. 16]
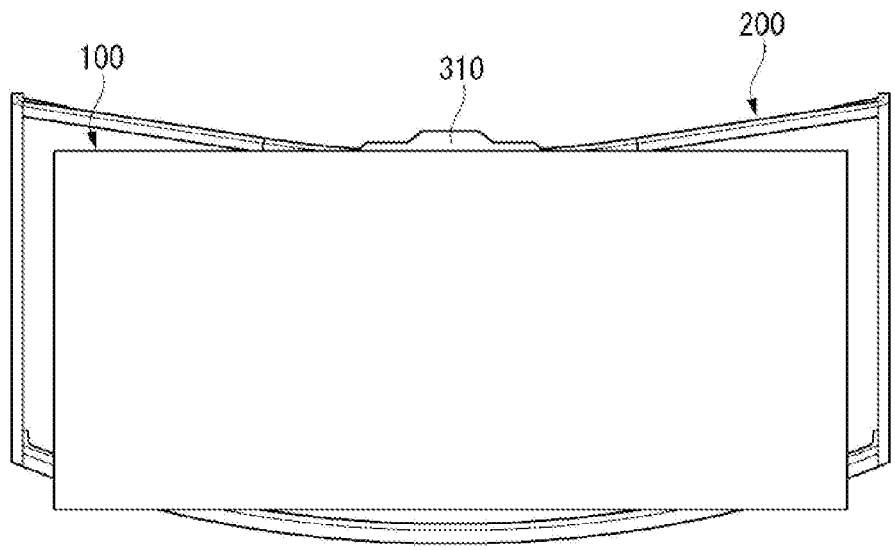
[FIG. 17]
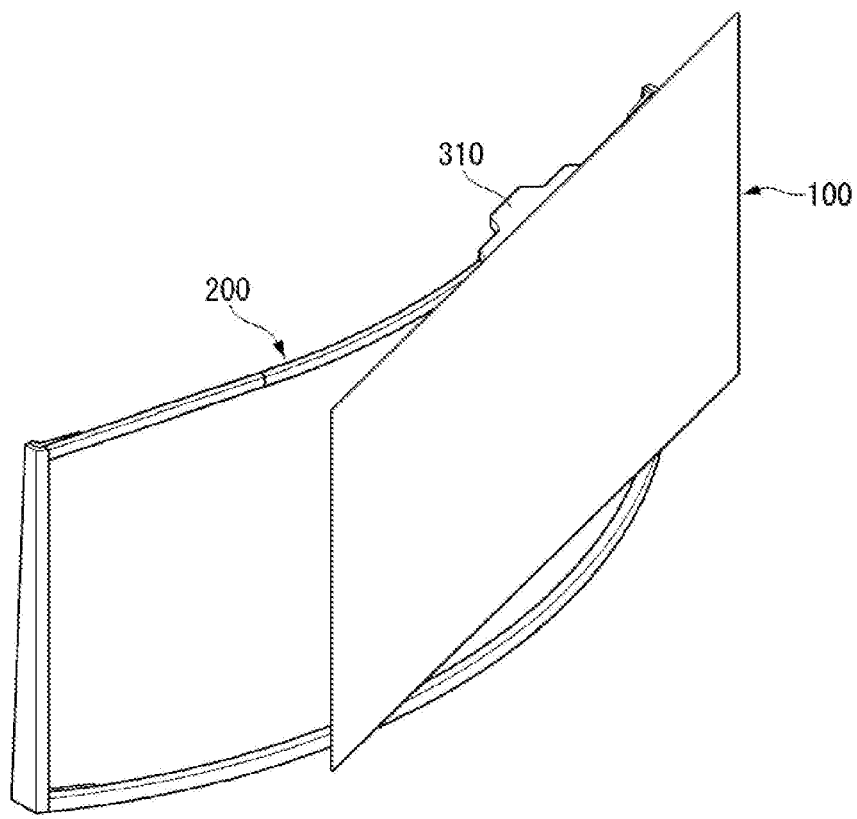

【FIG. 18】
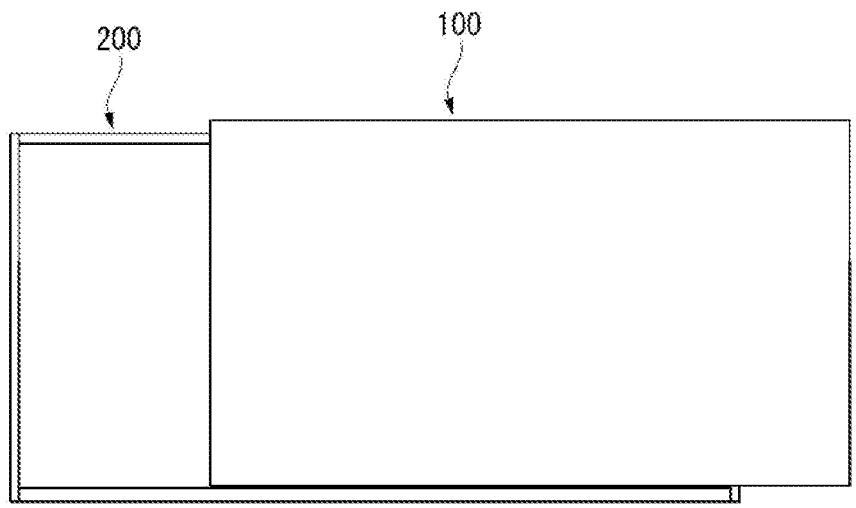
【FIG. 19】
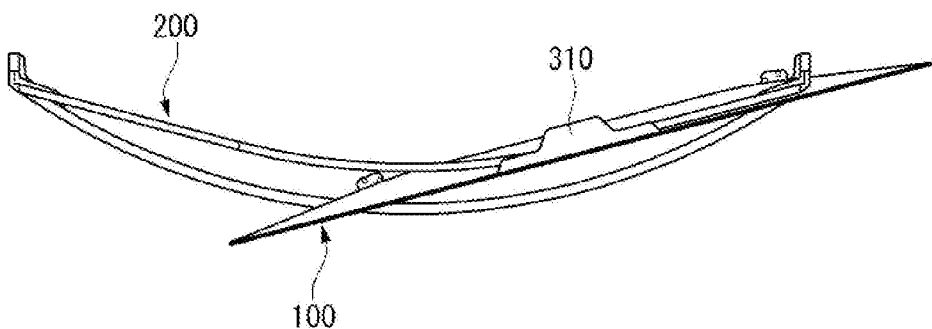

【FIG. 20】
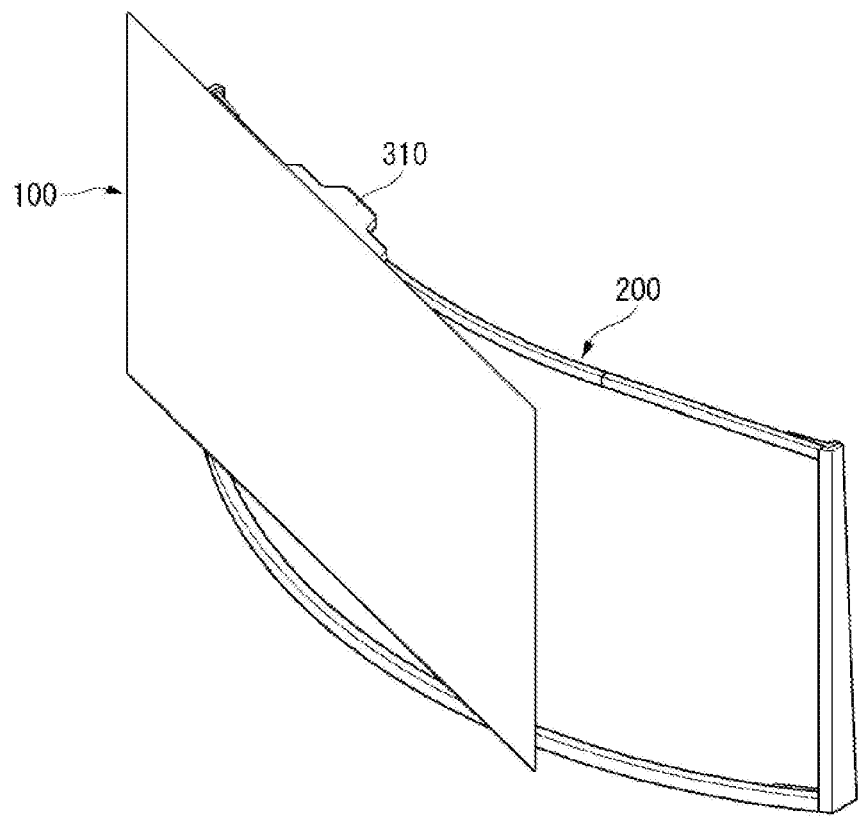
【FIG. 21】
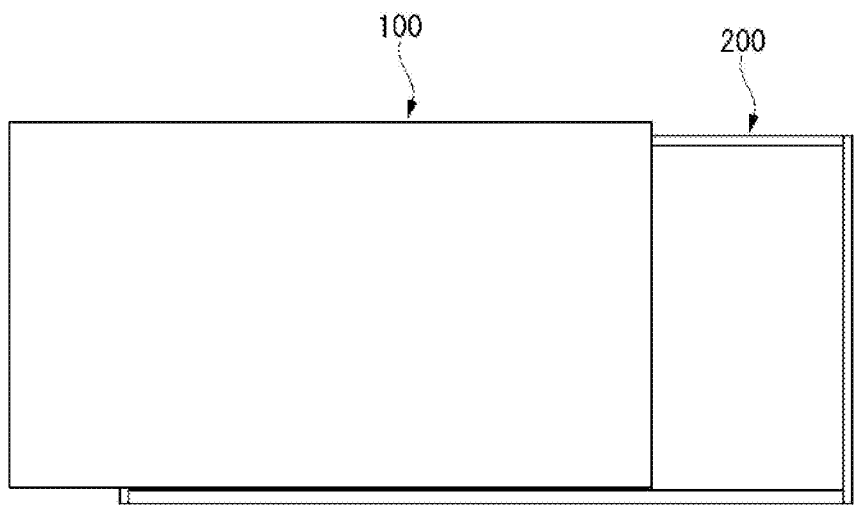

[FIG. 22]
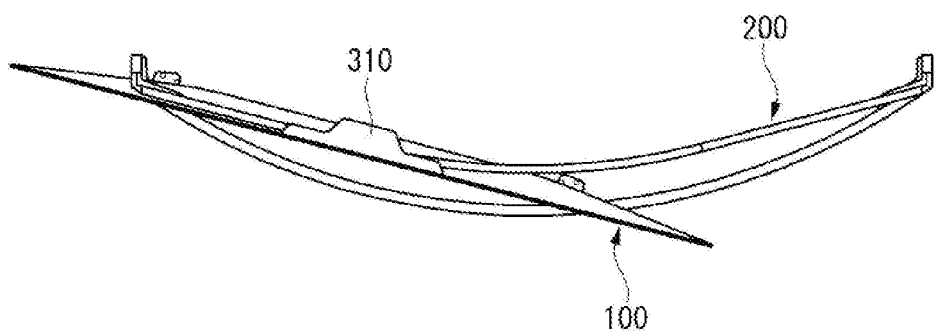
[FIG. 23]
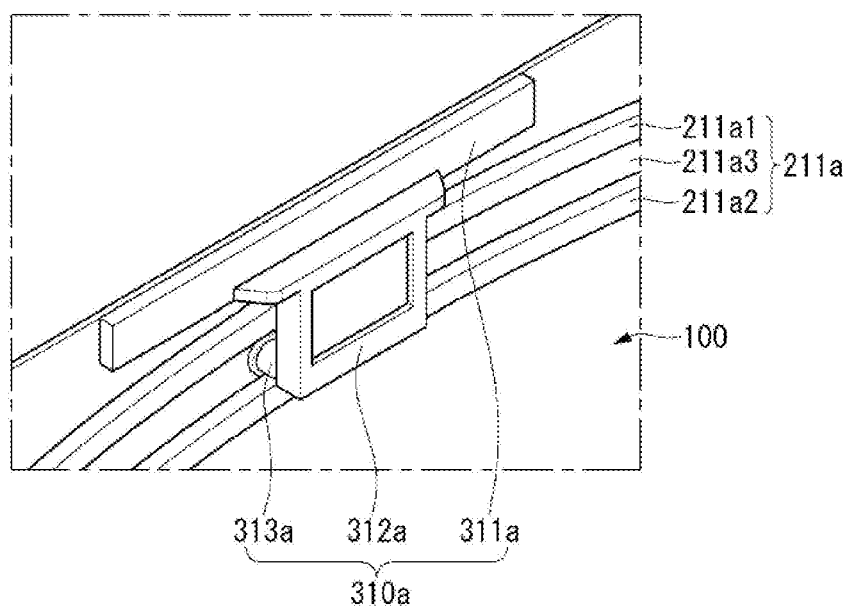

DISPLAY DEVICE

CROSS-REFERENCE TO RELATED APPLICATIONS

This application is the National Stage filing under 35 U.S.C. 371 of International Application No. PCT/KR2018/006730, filed on Jun. 14, 2018, which claims the benefit of earlier filing date and right of priority to Korean Application No. 10-2018-0005690, filed on Jan. 16, 2018, the contents of which are all hereby incorporated by reference herein in their entirety.

TECHNICAL FIELD

The present disclosure relates to a display device.

BACKGROUND ART

As the information society develops, the demand for display devices is also increasing in various forms, and in response to this, various display devices such as a liquid crystal display device (LCD), a plasma display panel (PDP), an electroluminescent display (ELD), and a vacuum fluorescent display (VFD) have been researched and used.

Among them, a display device using an organic light emitting diode (OLED) has advantages in that it has excellent luminance characteristics and viewing angle characteristics compared to a liquid crystal display device, and can be implemented in an ultra-thin form without requiring a backlight unit.

Recently, many studies have been conducted on the assembly structure of such display devices.

DETAILED DESCRIPTION OF INVENTION

Technical Problem

The present disclosure aims to solve the above-mentioned problems and other problems. In addition, the present disclosure aims to provide a display device capable of adjusting a screen angle while sliding along a frame bent in a curved line.

Technical Solution

According to an aspect of the present disclosure, the present disclosure provides a display device including a display module, a first frame that is disposed to be long along an upper side of the display module and is convexly bent toward a front side of the display module, a second frame that is spaced apart from the first frame in the vertical direction, is disposed to be long along a lower side of the display module, and is convexly bent in the same direction as the first frame, a third frame disposed between one side of the first frame and one side of the second frame, a fourth frame spaced apart from the third frame in the left-right direction and disposed between the other side of the first frame and the other side of the second frame, an upper sliding member mounted movably in the first frame and fixed to the upper side of the display module, and a lower sliding member mounted movably in the second frame and fixed to the lower side of the display module.

In addition according to another aspect of the present disclosure, the lower sliding member may include a second sliding member mounted movably in the second frame and a third sliding member mounted movably in the second frame and spaced apart from the second sliding member in the left-right direction.

In addition according to another aspect of the present disclosure, the first frame may include a first partial frame convexly bent toward the front side of the display module, a second partial frame disposed on one side of the first partial frame and formed to be long in a straight line to be connected to an upper side of the third frame, and a third partial frame disposed on the other side of the first partial frame and formed to be long in a straight line to be connected to an upper side of the fourth frame.

In addition according to another aspect of the present disclosure, the first sliding member may be mounted on the first partial frame and may move within the first partial frame.

In addition according to another aspect of the present disclosure, the first frame may be disposed behind the display module, and a central part of the second frame may protrude more than a front surface of the display module.

In addition according to another aspect of the present disclosure, a radius of curvature of the first partial frame may be shorter than a radius of curvature of the second frame.

In addition according to another aspect of the present disclosure, a center of curvature of the first partial frame may be the same as a center of curvature of the second frame.

In addition according to another aspect of the present disclosure, the first sliding member may include an upper mounting member, an upper roller housing disposed at a lower part or a lower end of the upper mounting member, and an upper roller disposed inside the upper roller housing, wherein the upper roller may include a first upper roller in contact with an upper side of the first partial frame, a second upper roller facing or in contact with a lower side of the first partial frame, a third upper roller spaced apart from the first upper roller in the left-right direction and in contact with the upper side of the first partial frame, and a fourth upper roller spaced apart from the second upper roller in the left-right direction and facing or in contact with the lower side of the first partial frame.

In addition according to another aspect of the present disclosure, the second and third sliding members may include a lower mounting member, a lower roller housing disposed at a lower part or a lower end of the lower mounting member, and a lower roller disposed inside the lower roller housing, wherein the lower roller may be in contact with an upper side of the second frame.

In addition according to another aspect of the present disclosure, the upper sliding member may be coupled to a back surface of the display module, and an adhesive member may be disposed between the back surface of the display module and the upper sliding member.

Advantageous Effects

According to an embodiment of the present disclosure, the screen angle can be adjusted while sliding along a frame bent in a curved line.

In addition, according to an embodiment of the present disclosure, the user's convenience can be improved by easily adjusting the screen angle of the display panel depending on the user's location.

In addition, according to an embodiment of the present disclosure, the display panel can be stably supported by using a frame bent in a curved line.

Additional scope of applicability of the present disclosure will become apparent from the following detailed description. However, various changes and modifications within the spirit and scope of the present disclosure may be clearly understood by those skilled in the art, and thus, it should be understood that specific embodiments, such as the detailed description and preferred embodiments of the present disclosure, are given only by way of illustration.

DESCRIPTION OF DRAWINGS

FIG. 1 is diagrams illustrating an example of a display device according to an embodiment of the present disclosure.

FIGS. 2 to 5 are diagrams illustrating examples of a frame according to an embodiment of the present disclosure.

FIGS. 6 to 9 are diagrams illustrating examples of a first sliding member according to an embodiment of the present disclosure.

FIGS. 10 to 12 are diagrams illustrating examples of second and third sliding members according to an embodiment of the present disclosure.

FIGS. 13 to 22 are diagrams illustrating an operation of a display device according to an embodiment of the present disclosure.

FIG. 23 is a diagram illustrating an example of a first sliding member according to another embodiment of the present disclosure.

MODE FOR INVENTION

Hereinafter, embodiments of the present disclosure will be described in detail with reference to the accompanying drawings, however, the same or similar elements are denoted by the same reference numerals regardless of the reference numerals, and redundant description thereof will be omitted.

The suffixes "module" and "part" for components used in the following description are given or mixed in consideration of ease of specification, and do not have their own meaning or role. Further, in describing the embodiments disclosed in this specification, when it is determined that the detailed description of the related art is likely to blur the gist of the embodiment disclosed in this specification, a detailed description thereof will be omitted. Also, the accompanying drawings are only for the purpose of easily understanding the embodiments disclosed in the present disclosure, and the technical idea disclosed in the present disclosure is not limited by the accompanying drawings, it should be understood that the present disclosure include all modifications, equivalents and substitutes included within the spirit and technical scope of the present disclosure.

The terms first, second, etc. may be used to describe various components, but the components are not limited by such terms. The terms are used only for the purpose of distinguishing one component from other components.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

A singular expression can include a plural expression as long as it does not have an apparently different meaning in context.

In the present disclosure, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Hereinafter, an organic light emitting diode display panel (OLED) will be described as an example of a display panel, but the display panel applicable to the present disclosure is not limited to the OLED panel, and it may also be a plasma display panel (PDP), a field emission display (FED), or a liquid crystal panel (LCD).

Referring to FIG. 1, a display device 1000 may include a display module 100 and a frame 200.

The display module 100 may include a display panel 110, a module cover 130 (see FIG. 3), and a back cover 150 (see FIG. 3).

The display panel 110 may include a first long side LS1, a second long side LS2 opposite the first long side LS1, a first short side SS1 adjacent to the first long side LS1 and the second long side LS2, and a second short side SS2 opposite the first short side SS1.

Here, it is possible that the first short side area SS1 is referred to as a first side area, the second short side area SS2 is referred to as a second side area opposite the first side area, the first long side area LS1 is referred to as a third side area adjacent to the first side area and the second side area and positioned between the first side area and the second side area, and the second long side area LS2 is referred to as a fourth side area adjacent to the first side area and the second side area and positioned between the first side area and the second side area and opposite the third side area.

In addition, for convenience of description, although lengths of the first and second long sides LS1 and LS2 are longer than lengths of the first and second short sides SS1 and SS2, the lengths of the first and second long sides LS1 and LS2 may be approximately equal to the lengths of the first and second short sides SS1 and SS2.

In addition, hereinafter, a first direction X(DR1) may be a direction parallel to the long sides LS1 and LS2 of a display panel 110, and a second direction Y(DR2) may be a direction parallel to the short sides SS1 and SS2 of the display panel 110. A third direction DR3 may be a direction perpendicular to the first direction (X,DR1) and/or the second direction (Y,DR2).

In another aspect, a side where the display panel 110 of the display device 1000 displays images may be referred to as a front side or a front surface. When the display panel 110 of the display device 1000 displays images, a side where the images cannot be observed may be referred to as a back side or a back surface. When looking at the display panel 110 of the display device 1000 from the front side or the front surface, the first long side LS1 may be referred to as an upper side or an upper surface. Similarly, the second long side LS2 may be referred to as a lower side or a lower surface. Similarly, the first short side SS1 may be referred to as a right side or a right surface, and the second short side SS2 may be referred to as a left side or a left surface.

In addition, the first long side LS1, the second long side LS2, the first short side SS1, and the second short side SS2 may be referred to as edges of the display panel 110 of the display device 1000. In addition, a point at which the first long side LS1, the second long side LS2, the first short side SS1, and the second short side SS2 meet each other may be referred to as a corner. For example, a point where the first long side LS1 meets the first short side SS1 may be a first corner C1, a point where the second short side SS2 meets the second long side LS2 may be a second corner C2, a point where the second long side LS2 meets the first short side SS1 may be a third corner C3, and a point where the first long side LS1 meets the second short side SS2 may be a fourth corner C4.

Here, a direction from the first short side SS1 to the second short side SS2 or a direction from the second short side SS2 to the first short side SS1 may be referred to as a left-right direction LR. A direction from the first long side LS1 to the second long side LS2 or a direction from the second long side LS2 to the first long side LS1 may be referred to as an up-down direction UD.

The display panel 110 may be an organic light emitting diode (OLED) panel. An active matrix type organic light emitting display panel includes an organic light emitting diode (hereinafter referred to as "OLED") that emits light by itself, and has advantages such as a fast response speed, high light emission efficiency, high brightness, and a wide viewing angle.

The OLED, which is a self-emission device, includes an anode electrode, a cathode electrode, and organic compound layers (HIL, HTL, EML, ETL, EIL) formed therebetween. The organic compound layer is formed of a hole injection layer (HIL), a hole transport layer (HTL), an emission layer (EML), an electron transport layer (ETL), and an electron injection layer (EIL). When a driving voltage is applied to the anode electrode and the cathode electrode, holes passing through the hole transport layer HTL and electrons passing through the electron transport layer ETL are moved to the emission layer EML to form excitons, and as a result, the emission layer EML generates visible light.

Accordingly, the OLED does not require a separate light source, and the volume and weight of the display device 1000 can be reduced. In addition, since the response speed of the OLED is 1000 times faster than that of the liquid crystal display device, an afterimage may not remain when displaying an image.

The frame 200 may be disposed below and behind the display module 100. The frame 200 may be mounted on the module cover 130 (see FIG. 3) and the back cover 150 (see FIG. 3) positioned at a back side of the display panel 110. The frame 200 may be referred to as a stand 200.

The frame 200 may be formed to be longer than the first long side LS1 and the second long side LS2 of the display panel 100.

Referring to FIGS. 2 and 3, the display module 100 may include the display panel 110, the module cover 130, and the back cover 150.

The display panel 110 may be an organic light emitting diode (OLED) panel.

The module cover 130 may be disposed on a back surface or a rear surface of the display panel 110.

The back cover 130 may be disposed behind the display panel 110 and may be disposed on a back surface or a rear surface of the module cover 130.

The frame 200 may be bent in a curved form. The frame 200 may be convexly bent toward a front of the display module 100.

The frame 200 may include a first frame 210 to a fourth frame 240.

The first frame 210 may be disposed around an upper part or upper side of the display module 100. The first frame 210 may be disposed to be long in the left-right direction X corresponding to the first long side LS1 (see FIG. 1) of the display panel 100. The first frame 210 may be formed to be longer than the first long side LS1 (see FIG. 1) of the display module 100. The first frame 210 may be bent in a curved shape. The first frame 210 may be referred to as an upper frame, a top frame, a first rail, an upper rail, and a top rail.

The second frame 220 may be disposed opposite the first frame 210 in the vertical direction Y. An upper part of the second frame 220 may be disposed to face a lower part or a lower side of the display module 100. The second frame 220 may be disposed to be long in the left-right direction X corresponding to the second long side LS2 (see FIG. 1) of the display module 100. The second frame 220 may be formed to be longer than the second long side LS2 (see FIG. 1) of the display module 100. The second frame 220 210 may be bent in a curved shape. The second frame 220 may be referred to as a lower frame, a bottom frame, a second rail, a lower rail, and a bottom rail.

The third frame 230 may be disposed between one side of the first frame 210 and one side of the second frame 220. The one side of the first and second frames 210 and 220 may be referred to as a right side of the first and second frames 210 and 220. The third frame 230 may be disposed to be long in the vertical direction Y corresponding to the first short side SS1 (see FIG. 1) of the display module 100. The third frame 230 may be formed to be substantially the same as or shorter than the first short side SS1 (see FIG. 1) of the display module 100. The third frame 230 may be referred to as a right side frame, a right frame or a supporting frame.

The fourth frame 240 may be disposed opposite the third frame 230 in the left-right direction X. The fourth frame 240 may be disposed between the other side of the first frame 210 and the other side of the second frame 220. The other side of the first and second frames 210 and 220 may be referred to as a left side of the first and second frames 210 and 220. The fourth frame 240 may be disposed to be long in the vertical direction Y corresponding to the second short side SS2 (see FIG. 1) of the display module 100. The fourth frame 240 may be formed to be substantially the same or shorter than the second short side SS2 (see FIG. 1) of the display module 100. The fourth frame 240 may be referred to as a left side frame, a left frame, or a supporting frame.

Sliding members 310, 330, and 350 may be disposed on a back surface or a rear surface and a lower part or a lower surface of the display module 100. The sliding members 310, 330, and 350 may be fastened or mounted to the first frame 210 and the second frame 220. The sliding members 310, 330, and 350 may be referred to as sliders. The sliding members 310, 330, and 350 may include a first sliding member 310 to a third sliding member 350.

The first sliding member 310 may be disposed between the display module 100 and the first frame 210. The first sliding member 310 may be disposed near or around the first long side LS1 (see FIG. 1) of the display module 100. The first sliding member 310 is fixed to the back surface or the rear surface of the module cover 130 and may be mounted on the first frame 210. The first sliding member 310 may be referred to as an upper sliding member or an upper slider.

The second sliding member 330 may be disposed to be spaced apart from the first sliding member 310 in the vertical direction Y. The second sliding member 330 may be disposed near or around the second long side LS2 (see FIG. 1) of the display module 100. The second sliding member 330 may be disposed between the display module 100 and the second frame 220. The second sliding member 330 may be fixed to the lower surface or a bottom surface of the display module 100 and may be mounted on the second frame 220. The second sliding member 330 may be referred to as a lower sliding member or a lower slider.

The third sliding member 350 may be disposed to be spaced apart from the first sliding member 310 in the vertical direction Y, and may be disposed to be spaced apart from the second sliding member 330 in the left-right direction X. The third sliding member 350 may be disposed near or around the second long side LS2 (see FIG. 1) of the display module 100. The third sliding member 350 may be disposed between the display module 100 and the second frame 220. The third sliding member 350 may be fixed to the lower surface or the bottom surface of the display module 100 and may be mounted on the second frame 220. The third sliding member 350 may be referred to as a lower sliding member or lower slider.

As described above, the display module 100 may be placed or positioned on the second sliding member 330 and the third sliding member 350 which are lower sliding members. Accordingly, the first sliding member 310 may be disposed to be in contact with or face an upper side of the back surface of the display module 100, and the second and third sliding members 310, 330 and 350 may be disposed to be in contact with or face the lower surface or the bottom surface of the display module 100. Since the first sliding member 310 to the third sliding member 350 are disposed on each of the upper and lower sides of the display module 100 together, it is possible to prevent the display module 100 having a thin thickness from being shaken or bent. Accordingly, the first sliding member 310 to the third sliding member 350 are simultaneously disposed on the upper and lower sides of the display module 100, so that the display module 100 having a relatively thin thickness can be stably supported.

An adhesive member (not shown) may be disposed between the sliding members 310, 330 and 350 and the display module 100. The adhesive member (not shown) may fix or fasten the sliding members 310, 330, 350 to the display module 100. For example, the adhesive member (not shown) may include double-sided tape, silicone, or the like.

A fastening member 201 may connect the first frame 210 to the fourth frame 240 with each other and fix or fasten them. The fastening member 201 may include a plurality of connecting members 201a to 201d and a plurality of fastening parts S.

The connecting members 201a to 201d may be bent at least once. For example, the connecting members 201a to 201d may have an alphabetic capital letter "L" shape. The fastening part S may penetrate the connecting members 201a to 201d to fix the first frame 210 to the fourth frame 240. For example, the fastening portion S may include screws, bolts, washers, and the like.

The connecting members 201a to 201d may include a first connecting member 201a to a fourth connecting member 201d.

The first connecting member 201a may connect the one side of the first frame 210 and an upper side of the third frame 230. The plurality of fastening parts S may penetrate the first connecting member 201a being in contact with or facing the one side of the first frame 210 and the upper side of the third frame 230 to fix them.

The second connecting member 201b may connect the one side of the second frame 220 and a lower side of the third frame 230. The plurality of fastening parts S may penetrate the second connecting member 201b being in contact with or facing the one side of the second frame 220 and the lower side of the third frame 230 to fix them.

The third connecting member 201c may connect the other side of the second frame 220 and an upper side of the fourth frame 240. The plurality of fastening parts S may penetrate the third connecting member 201c being in contact with or facing the other side of the second frame 220 and the upper side of the fourth frame 240 to fix them.

The fourth connecting member 201d may connect the other side of the second frame 220 and a lower side of the fourth frame 240. The plurality of fastening parts S may penetrate the fourth connecting member 201d being in contact with or facing the other side of the second frame 220 and the lower side of the fourth frame 240 to fix them.

Referring to FIG. 4, the first frame 210 may include a plurality of partial frames 211, 212 and 213. For example, the first frame 210 may include a first partial frame 211 to a third partial frame 213.

The first partial frame 211 may be bent in a curved shape. The first sliding member 310 may be mounted on the first partial frame 211. The first sliding member 310 may slide within the first partial frame 211.

The second partial frame 212 may be elongated or formed in a straight line. The second partial frame 212 may be disposed between the first partial frame 211 and the third frame 230. The second partial frame 212 may connect one side of the first partial frame 211 and the upper side of the third frame 230. The one side of the first partial frame 211 may be referred to as a right side of the first partial frame 211.

The third partial frame 213 may be elongated or formed in a straight line. The third partial frame 213 may be disposed between the first partial frame 211 and the fourth frame 240. The third partial frame 213 may connect the other side of the first partial frame 211 and the upper side of the fourth frame 240. The other side of the first partial frame 211 may be referred to as a left side of the first partial frame 211.

As described above, the first partial frame 211 may be disposed between the second partial frame 212 and the third partial frame 213.

When looking at the display device 1000 from the top to the bottom, the first sliding member 310 may be positioned between the second sliding member 330 and the third sliding member 350.

In addition, when looking at the display device 1000 from the top to the bottom, the first frame 210 is always disposed at the back B of the display module 100, but a part of the bent second frame 220 may protrude more toward the front F of the display module 100 than a front surface of the display module 100.

Referring to FIG. 5, the first frame 210 may have a first length L1, and the second frame 220 may have a second length L2. The first length L1 and the second length L2 may be values measuring lengths protruding from the fourth frame 240 when looking at the display device 1000 from the right side (or left side) to the left side (or right side).

In addition, a third length L3 may be a value measuring a length spaced from the fourth frame 240 to the back surface or the rear surface of the display panel 100.

The first length L1 may be shorter than the second length L2. The second length L2 may be longer than the third length L3. The third length L3 may be longer than the first length L1 and shorter than the second length L2.

Since the first length L1 is formed to be shorter than the third length L3, the first frame 210 may be disposed at the back B of the display module 100. Since the second length L2 is formed to be longer than the third length L3, the second frame 220 may further protrude to the front F of the display module 100.

As described above, since the second frame 220 is disposed to face the lower part or lower surface of the display module 100 and is formed to protrude more than the display module 100, and the first frame 210 is disposed on the upper part of display module 100 and is formed to be disposed at the back B of the display module 100, it is possible to prevent the display module 100 from falling down to the front F.

Referring to FIGS. 6 to 8, the first sliding member 310 may include an upper mounting member 311, upper rollers 315, 316, 317, and upper roller housings 312, 313.

The upper mounting member 311 may include a central area (a) having a first width W1 and an outer area (b) having a second width W2 less than the first width. The outer area (b) may extend in the left-right direction X around the central area (a). In other words, the central area (a) of the upper mounting member 311 may protrude toward the back than the outer area (b).

An adhesive member (not shown) may fix the central area (a) and the outer area (b) of the upper mounting member 311 to the back or rear surface of the display module 100.

The first frame 210 may be disposed below the central area (a) of the upper mounting member 311.

In addition, the upper mounting member 311 may include a plurality of fastening holes h1 on the upper part. The plurality of fastening holes h1 may penetrate the upper part of the upper mounting member 311.

The upper roller housings 312 and 313 may be disposed at a lower part or a lower end of the upper mounting member 311. An upper end or an upper part of the upper roller housings 312 and 313 may be open. The first frame 210 may penetrate the upper roller housings 312 and 313 in the left-right direction X. The upper roller housings 312 and 313 may surround the first frame 210 and may be spaced apart from the first frame 210 at a predetermined interval.

The upper roller housings 312 and 313 may include a first upper roller housing 312 and a second upper roller housing 313.

The first upper roller housing 312 and the second upper roller housing 313 may be disposed adjacent to each other. The second upper roller housing 313 may face or be in contact with the first upper roller housing 312 in the left-right direction X.

The first upper roller housing 312 and the second upper roller housing 313 may include a plurality of roller holes Rh1 and Rh2 on side surfaces. The plurality of roller holes Rh1 and Rh2 may penetrate the side surfaces of the first and second upper roller housings 312 and 313.

The upper roller housings 312 and 313 may include a plurality of fastening grooves h2 on an upper part. The fastening groove h2 may correspond to the fastening hole h1. A fastening member (not shown) may penetrate the fastening hole h1 and be inserted into the fastening groove h1. The fastening member (not shown) may fix the upper mounting member 311 and the upper roller housings 312 and 313.

The upper rollers 315, 316, and 317 may be disposed inside the upper roller housings 312, 313. Both sides of the upper rollers 315, 316 and 317 may be inserted into the roller holes Rh1 and Rh2 disposed on the side surfaces of the first and second upper roller housings 312 and 313. The upper rollers 315, 316, 317 may be referred to as upper sliding rollers.

The upper rollers 315, 316, and 317 may include a first upper roller 315 to a fourth upper roller (not shown).

The first upper roller 315 may be disposed inside the first upper roller housing 312. The first upper roller 315 may be disposed between the central area (a) of the upper mounting member 311 and the first frame 210. The first upper roller 315 may face the central area (a) of the upper mounting member 311 and may be in contact with an upper end or an upper part of the first frame 210.

The second upper roller 316 may be spaced apart from the first upper roller 315 in the vertical direction Y to be disposed inside the first upper roller housing 312. The second upper roller 316 may be disposed between a lower part of the first upper roller housing 312 and the first frame 210. The second upper roller 316 may face an inner lower part of the first upper roller housing 312 and may be in contact with a lower end or a lower part of the first frame 210. Accordingly, the first frame 210 may be disposed between the first upper roller 315 and the second upper roller 316.

The third upper roller 317 may be spaced apart from the first upper roller 315 in the left-right direction X to be disposed inside the second upper roller housing 313. The third upper roller 317 may be disposed between the central area (a) of the upper mounting member 311 and the first frame 210. The third upper roller 317 may face the central area (a) of the upper mounting member 311 and may be in contact with the upper end or the upper part of the first frame 210.

The fourth upper roller (not shown) may be spaced apart from the third upper roller 317 in the vertical direction Y to be disposed inside the second upper roller housing 313. The fourth upper roller (not shown) may be disposed between a lower part of the second upper roller housing 313 and the first frame 210. The fourth upper roller (not shown) may face an inner lower part of the second upper roller housing 313 and may be in contact with the lower end or the lower part of the first frame 210. Accordingly, the first frame 210 may be disposed between the third upper roller 317 and the fourth upper roller (not shown).

Referring to FIG. 9, sliding covers 311c and 312c may include a first sliding cover 311c and a second sliding cover 312c. The first sliding cover 311c may cover the upper part or upper surface of the upper mounting member 311. In addition, the second sliding cover 312c may cover the first upper roller housing 312 and the second upper roller housing 313.

The first sliding member 310 covers the upper mounting member 311 and the upper roller housings 312 and 313 using the first sliding cover 311c and the second sliding cover 312c, so that it is possible to prevent dust or foreign matter from entering the upper mounting member 311 and the upper roller housings 312 and 313.

Referring to FIGS. 10 to 12, the second sliding member 330 may include a lower mounting member 331, a lower roller 335 and a lower roller housing 333.

Since the second sliding member 330 and the third sliding member 350 have substantially the same configuration, the second sliding member 330 will be described with reference to FIGS. 10 to 12.

The lower mounting member 331 may be formed in a shape capable of having a width wider than that of the second frame 220. The lower mounting member 331 may face the lower surface or the bottom surface of the display module 100. An adhesive member (not shown) may fix the lower surface or the bottom surface of the display module 100 placed on the lower mounting member 331.

The second frame 220 may be disposed below the display module 100 or the lower mounting member 331.

In addition, the lower mounting member 331 may include a plurality of fastening holes h3 on an upper part. The plurality of fastening holes h3 may penetrate the upper part of the lower mounting member 331.

The lower roller housing 333 may be disposed on a lower part or a lower end of the lower mounting member 331. The second frame 220 may penetrate the lower roller housing 333 in the left-right direction X. The lower roller housing 333 may surround both sides of the second frame 220, and may be spaced apart from the second frame 220 at a predetermined interval.

The lower roller housing 333 may include a plurality of fastening grooves h4 on an upper part.

The fastening member 201 may penetrate the fastening hole h3 and be inserted into the fastening groove h4. The fastening member 201 may fix the lower mounting member 331 and the lower roller housing 333.

The plurality of fastening grooves h4 may be formed in a larger number than the fastening holes h3 disposed in the lower mounting member 331. Thus, the fastening groove h4 of the lower roller housing 333 is formed more than the fastening hole h3 of the lower mounting member 331, a length between the second sliding member 330 and the third sliding member 350 can be easily adjusted depending on the size of the display module 100. Accordingly, the second sliding member 330 and the third sliding member 350 can more stably sustain or support the display module 100.

The lower roller 335 may be disposed inside the lower roller housing 333. The lower roller 335 may be referred to as a lower sliding roller.

The lower roller 335 may be disposed between the lower mounting member 331 and the second frame 220. The lower roller 335 may face the lower mounting member 331 and may be in contact with an upper end or an upper part of the second frame 220.

Referring to FIGS. 13 to 15, the second frame 220 may be bent in a curved shape. The first partial frame 211 among the first frames 210 may be bent in a curved shape. The remaining second and third partial frames 212 and 213 except for the first partial frame 211 may be formed in a straight line.

The first partial frame 211 may have a first radius of curvature R1 from a center of curvature C. The center of curvature C may be a center of a circle having the first radius of curvature R1 as the length of the radius. The first radius of curvature R1 may be referred to as a first radius.

The second frame 220 may have a second radius of curvature R2 from the center of curvature C. The center of curvature C may be the center of a circle having the second radius of curvature R2 as the length of the radius. The second radius of curvature R2 may be referred to as a second radius.

The center of curvature C of the first partial frame 211 is the same as the center of curvature C of the second frame 220.

The upper rollers 315, 316, 317 and the lower roller 335 are disposed in a normal direction of the curvature based on the center of curvature C to easily implement a sliding operation.

Thus, the center of curvature C of the first partial frame 211 is disposed substantially to be the same as the center of curvature C of the second frame 220, the upper rollers 315, 316, 317 of the first sliding member 310 sliding on the first partial frame 211 and the lower roller 335 of the second and third sliding members 330 and 350 sliding on the second frame 220 may operate smoothly along the bent first and second frames 210 and 220.

Accordingly, since the display device 1000 can move the display module 100 mounted on the bent first frame 210 and the second frame 220 in a curved manner it may freely adjust a screen angle of the display panel 100 depending on the user's location.

If the center of curvature C of the first partial frame 211 is the same as the center of curvature C of the second frame 220, the first radius of curvature R1 may be less than the second radius of curvature R2. The second frame 220 may protrude more toward the front of the display module 100 than the first frame 210.

Referring to FIGS. 16 to 22, the first sliding member 310 may be attached to the back surface of the display module 100 and mounted on the frame 200. In addition, the display module 100 may be placed on the second sliding member 330 (see FIG. 13) and the third sliding member 350 (see FIG. 13) and mounted on the frame. In FIGS. 16 to 22, all of the first sliding member 310 to the third sliding member 350 are collectively referred to as the sliding member 310.

As shown in FIG. 16, the display module 100 may be basically disposed at the center of the frame 200.

If the viewer is located or standing on the right side of the frame 200 rather than the center of the frame 200, the display module 100 may naturally move the display module 100 mounted on the frame 200 to the left along the curved frame 200 along the sliding member 310. FIGS. 17 to 19 illustrate the display module 100 moved to the right at various angles.

On the other hand, if the viewer is located or standing on the left side of the frame 200 rather than the center of the frame 200, the display module 100 may naturally move the display module 100 mounted on the frame 200 to the left along the curved frame 200 along the sliding member 310. FIGS. 20 to 22 illustrate the display module 100 moved to the left at various angles.

Referring to FIG. 23, a first frame 211a may include a first upper frame 211a1, a second upper frame 211a2, and an upper groove 211a3.

The first upper frame 211a1 may be disposed around the upper part or upper side of the display module 100. The first upper frame 211a1 may be disposed to be long in the left-right direction X corresponding to the first long side LS1 (refer to FIG. 1) of the display module 100.

The second upper frame 211a2 may be disposed to be spaced apart from the first upper frame 211a1 in the vertical direction. The second upper frame 211a2 may be disposed around the upper part or upper side of the display module 100. The second upper frame 211a2 may be disposed to be long in the left-right direction X corresponding to the first long side LS1 (refer to FIG. 1) of the display module 100.

The upper groove 211a3 may be formed concavely between the first upper frame 211a1 and the second upper frame 211a2.

A fourth sliding member 310a may include an upper mounting member 311a, an upper roller 313a, and an upper roller housing 312a.

The upper mounting member 311 may be disposed to be long along the first long side LS1 (see FIG. 1) of the display module 100.

The upper roller housing 312a may protrude from the upper mounting member 311 to the back of the display module 100 and may be bent below the display module 100.

The upper roller housing 312a may be spaced apart from the upper part or upper side of the first upper frame 211a1.

The upper roller 313a may be disposed inside the upper roller housing 312a. One side of the upper roller 313a may be fastened to the inner side of the upper roller housing 312a.

The upper roller 313a may be inserted into the upper groove 211a3, face the first upper frame 211a1, and be in contact with the second upper frame 211a2.

Since the upper roller 313a is inserted into the upper groove 211a3, it is possible to prevent the display module 100 from falling down to the front F.

Certain embodiments or other embodiments of the present disclosure described above are not mutually exclusive or distinct from each other. The certain embodiments or other embodiments of the present disclosure described above may be used together or combined with each other in configuration or function.

The above detailed description should not be construed in all aspects as limiting and should be considered illustrative. The scope of the present disclosure should be determined by rational interpretation of the appended claims, and all variations within the scope of equivalents of the present disclosure are included in the scope of the present disclosure.

The invention claimed is:

1. A display device comprising:
a non-curved display module;
a first frame corresponding to an upper side of the display module and convexly curved toward a front-facing direction of the display module;
a second frame corresponding to a lower side of the display module and convexly curved toward the front-facing direction of the display module;
a third frame disposed between a first end of the first frame and a first end of the second frame;
a fourth frame laterally spaced apart from the third frame and disposed between a second end of the first frame and a second end of the second frame; and
an upper movement member fixed toward the upper side of the display module and configured to move along the first frame and
a lower movement member fixed toward the lower side of the display module and configured to move along the second frame to allow change of a facing direction of the non-curved display module.

2. The display device of claim 1, wherein the lower movement member includes:
a plurality of lower movement members laterally spaced apart from each other along the lower side of the display module.

3. The display device of claim 1, wherein the first frame includes:
a first partial frame convexly curved toward the front-facing direction of the display module;
a second partial frame configured to be straight and connecting a first end of the first partial frame to an upper end of the third frame; and
a third partial frame configured to be straight and connecting a second end of the first partial frame to an upper end of the fourth frame.

4. The display device of claim 3, wherein movement of the first movement member is within the first partial frame.

5. The display device of claim 1, wherein the first frame is disposed behind the display module, and a central part of the second frame protrudes further forward past a front surface of the display module.

6. The display device of claim 1, wherein a radius of curvature of the first partial frame is shorter than a radius of curvature of the second frame.

7. The display device of claim 1, wherein a center of curvature of the first partial frame is the same as a center of curvature of the second frame.

8. The display device of claim 1, wherein the first movement member comprises:
a first upper roller and a third upper roller in contact with an upper side of the first frame; and
a second upper roller and a fourth upper roller facing or in contact with a lower side of the first frame.

9. The display device of claim 2, wherein each of the plurality of lower movement members includes:
a lower roller in contact with an upper side of the second frame.

10. The display device of claim 1, wherein the upper movement member is coupled to a rear surface of the display module via an adhesive member.

11. The display device of claim 8, wherein the first movement member further comprises:
an upper mounting member configured to be coupled to a rear of the display module; and
an upper roller housing coupled to the upper mounting member,
wherein the first, second, third, and fourth upper rollers are disposed in the upper roller housing.

12. A display device comprising:
a display module;
a first frame corresponding to an upper side of the display module and convexly curved toward a front-facing direction of the display module;
a second frame corresponding to a lower side of the display module and convexly curved toward the front-facing direction of the display module;
a third frame disposed between a first end of the first frame and a first end of the second frame;
a fourth frame laterally spaced apart from the third frame and disposed between a second end of the first frame and a second end of the second frame;
an upper movement member fixed toward the upper side of the display module and configured to move along the first frame; and
a lower movement member fixed toward the lower side of the display module and configured to move along the second frame,
wherein the first frame is disposed behind the display module and a central part of the second frame protrudes further forward past a front surface of the display module.

13. A display device comprising:
a display module;
a first frame corresponding to an upper side of the display module and convexly curved toward a front-facing direction of the display module;
a second frame corresponding to a lower side of the display module and convexly curved toward the front-facing direction of the display module;
a third frame disposed between a first end of the first frame and a first end of the second frame;
a fourth frame laterally spaced apart from the third frame and disposed between a second end of the first frame and a second end of the second frame;
an upper movement member fixed toward the upper side of the display module and configured to move along the first frame; and
a plurality of lower movement members laterally spaced apart from each other and fixed toward the lower side of the display module and configured to move along the second frame, wherein each of the lower movement members comprises a lower roller disposed inside a lower roller housing and configured to roll along an upper side of the second frame.

\* \* \* \* \*